US009461605B2

(12) United States Patent
Sekiyama

(10) Patent No.: US 9,461,605 B2
(45) Date of Patent: Oct. 4, 2016

(54) ELECTRONIC DEVICE

(71) Applicant: Icom Incorporated, Osaka (JP)

(72) Inventor: Yoshio Sekiyama, Osaka (JP)

(73) Assignee: Icom Incorporated, Osaka (JP)

( * ) Notice: Subject to any disclaimer, the term of this patent is extended or adjusted under 35 U.S.C. 154(b) by 375 days.

(21) Appl. No.: 13/776,922

(22) Filed: Feb. 26, 2013

(65) Prior Publication Data

US 2013/0287213 A1    Oct. 31, 2013

(30) Foreign Application Priority Data

Apr. 26, 2012  (JP) ................ 2012-101793

(51) Int. Cl.
| | | |
|---|---|---|
| H03G 3/20 | (2006.01) | |
| H03G 3/30 | (2006.01) | |
| H04M 1/18 | (2006.01) | |
| H04M 1/03 | (2006.01) | |
| H02H 5/08 | (2006.01) | |
| H04R 3/00 | (2006.01) | |

(52) U.S. Cl.
CPC .............. *H03G 3/20* (2013.01); *H03G 3/3005* (2013.01); *H04M 1/03* (2013.01); *H04M 1/18* (2013.01); *H02H 5/083* (2013.01); *H04R 3/007* (2013.01); *H04R 2499/11* (2013.01)

(58) Field of Classification Search
CPC ....... H03G 3/20; H03G 3/3005; H04M 1/03; H04M 1/18; H04R 2499/11; H04R 3/007; H02H 5/083
USPC ........................................... 381/55
See application file for complete search history.

(56) References Cited

U.S. PATENT DOCUMENTS

| | | | | |
|---|---|---|---|---|
| 6,239,444 B1* | 5/2001 | Tanaka | .................. | B60S 1/0818 250/573 |
| 6,486,777 B2* | 11/2002 | Clark | ................. | G08B 21/0227 340/539.1 |
| 6,487,983 B1* | 12/2002 | Jonsson | ................ | B63C 9/0011 114/144 R |
| 8,489,141 B2* | 7/2013 | Tanaka | ................. | H01H 13/702 455/418 |
| 2007/0047747 A1* | 3/2007 | Yoshida | ................. | H04R 3/007 381/189 |
| 2012/0043916 A1* | 2/2012 | Yoshida | ............. | H05B 33/0815 315/363 |

FOREIGN PATENT DOCUMENTS

| | | |
|---|---|---|
| JP | 2003018685 A | 1/2003 |
| JP | 4680011 B | 3/2007 |
| JP | 2007067897 A | 3/2007 |
| JP | 2011-041292 A | 2/2011 |
| JP | 2011205196 A | 10/2011 |
| JP | 2012-044433 A | 3/2012 |

* cited by examiner

*Primary Examiner* — Davetta W Goins
*Assistant Examiner* — Oyesola C Ojo
(74) *Attorney, Agent, or Firm* — Muncy, Geissler, Olds & Lowe, P.C.

(57) ABSTRACT

An electronic device with a speaker, an amplifier for driving the speaker and a speaker grill provided on the front surface of the speaker includes a pickup detection unit for detecting that the electronic device has been picked up from water and a water discharge sound generation unit for generating a water discharge sound signal for discharging water having entered inside the speaker grill according to the detection of the pickup from the water and inputting the generated water discharge sound signal to the amplifier.

7 Claims, 5 Drawing Sheets

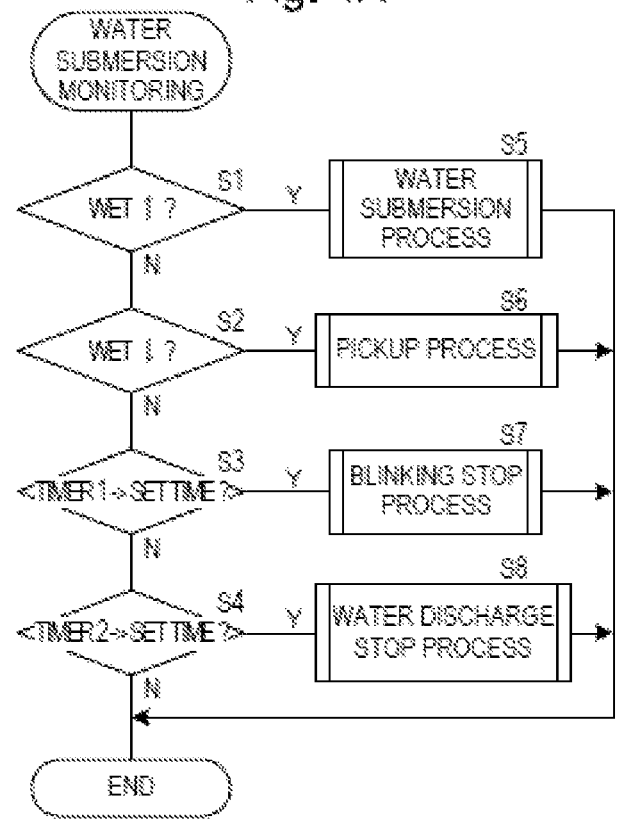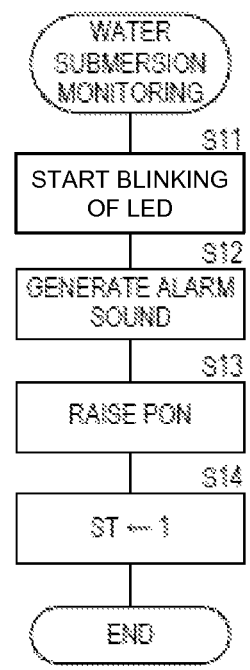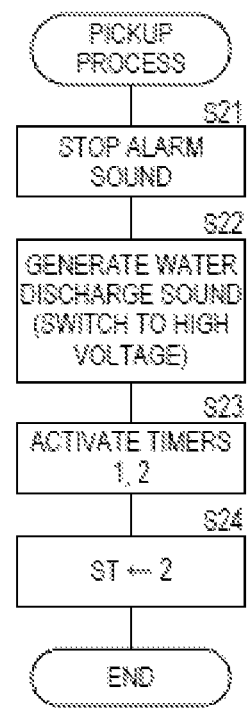

ELECTRONIC DEVICE

CROSS REFERENCE TO RELATED APPLICATION

The present invention is related to, claims priority from, and incorporates by reference Japanese Patent Application No. 2012-101793, filed on Apr. 26, 2012.

BACKGROUND OF THE INVENTION

1. Field of the Invention

The present invention relates to an electronic device, particularly to an electronic device including a speaker protected from the front by a speaker grill.

2. Description of the Related Art

JP2012-044433A discloses a transceiver whose housing is waterproofed so as not to impair functions even if the transceiver is dropped into water. In the case of such a waterproofed device, water submersion does not cause any problem in an electronic circuit, but water enters inside the speaker grill whereby sound may not transmit to the outside even if the speaker vibrates.

To solve this, a technology for strongly vibrating a speaker and discharging water inside a speaker grill by its pressure (sound pressure) is proposed in the publication of Japanese Patent No. 4680011.

Although water having entered inside the speaker grill can be discharged with the technology disclosed in the publication of Japanese Patent No. 4680011, it is cumbersome to activate this function since a user has to perform an operation of turning on a combination of a plurality of key switches. It is a severe requirement to have a user, who dropped his electronic device into water and picked it up in a hurry, perform this operation properly. If the user who picked up the submerged electronic device forgets to activate a water discharge function, no sound is output from that electronic device, wherefore it has been mistaken for a failure in some cases.

Even if sound is output from the electronic device picked up from water, water is thought to remain inside the speaker grill and it is not preferable to resume the use in that state.

BRIEF SUMMARY OF THE INVENTION

This invention aims to provide an electronic device which reliably discharges water inside a speaker grill after being picked up even if being dropped into water.

The present invention is directed to an electronic device, including a speaker; an amplifier for driving the speaker; a speaker grill provided on the front surface of the speaker; a water submersion detection unit for detecting that the electronic device has dropped onto water surface or into water (hereinafter, referred to as "water submersion") and detecting that the electronic device has been picked up from the water surface or from the water (hereinafter, referred to as "pickup"); and a sound signal generation unit for generating a water discharge sound signal for discharging water having entered inside the speaker grill according to the detection of the pickup and inputting the generated water discharge sound signal to the amplifier.

The sound signal generation unit may perform the generation of the water discharge sound signal and the input to the amplifier for a predetermined time.

Even if a sound volume adjustment circuit for adjusting a signal level of a sound signal to be input to the amplifier is provided in a stage preceding the amplifier, the sound signal generation unit may input the water discharge sound signal to the amplifier without via the sound volume adjustment circuit.

The above invention may further include a booster unit for boosting a power-supply voltage to be supplied to the amplifier to a voltage higher than a normal operation voltage in synchronization with the input of the water discharge sound signal to the amplifier by the sound signal generation unit.

The above invention may further include a light emission circuit including a light emitting element and configured to light or blink the light emitting element in parallel to the input of the water discharge sound signal to the amplifier by the sound signal generation unit.

The sound signal generation unit may generate an alarm sound signal for notifying the position of the electronic device and input the generated alarm sound signal to the amplifier until the electronic device is picked up after the water submersion.

The water submersion detection unit may include a pair of electrodes and detect the water submersion by an electrical connection of these electrodes to each other while detecting the pickup by the electrodes being electrically separated thereafter.

According to this invention, when the electronic device is picked up from water, water having entered inside the speaker grill can be automatically discharged.

BRIEF DESCRIPTION OF THE DRAWINGS

FIGS. 4A, 4B and 4C are flow charts showing operations of a control unit of the transceiver.

REFERENCE SIGNS LIST 1 transceiver
11 housing
18 speaker grill
25 speaker

DETAILED DESCRIPTION OF THE INVENTION

Figure 1A:
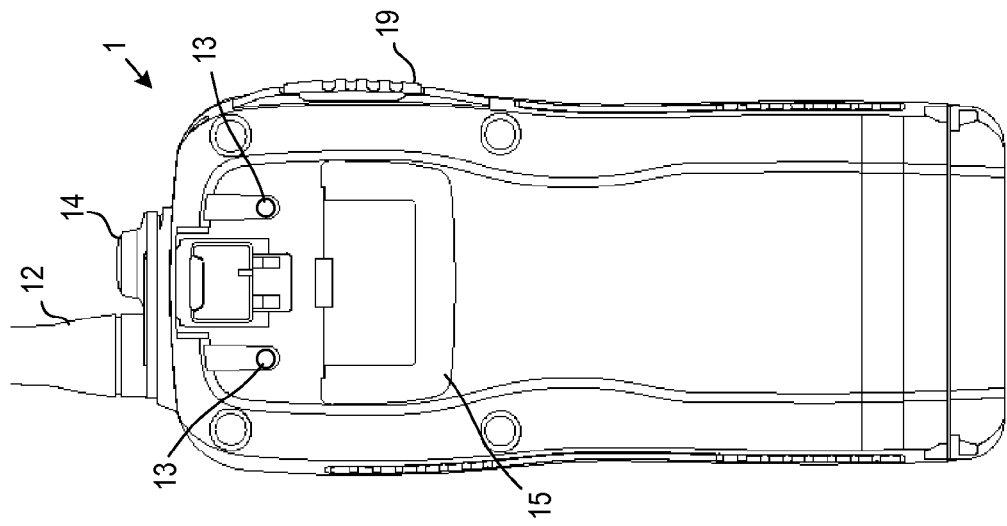
FIG. 1A is a front view of a transceiver which is an embodiment of this invention.
Figure 1B:
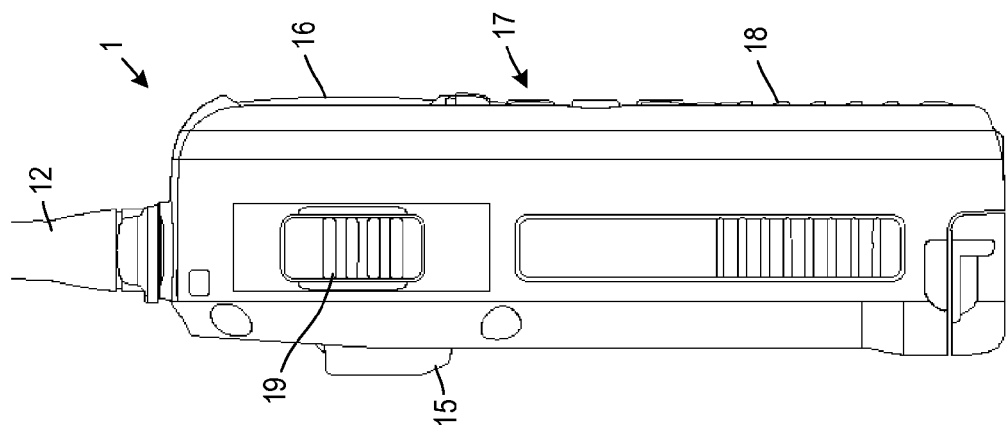
FIG. 1B is a right side view of the transceiver.
Figure 1C:
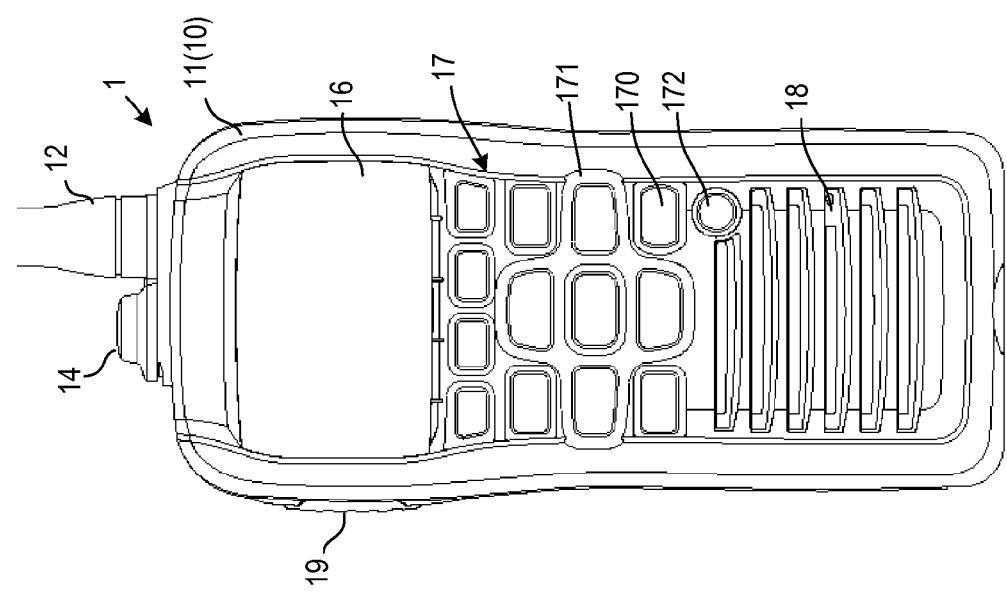
FIG. 1C is a rear view of the transceiver.

A transceiver which is an embodiment of this invention is described with reference to the drawings. FIG. 1 are external views of the transceiver. FIG. 1A is a front view of the transceiver, FIG. 1B is a right side view of the transceiver and FIG. 1C is a rear view of the transceiver.

First, the transceiver 1 is outlined. This transceiver 1 is a handy device for marine communication and carries out marine VHF band radio communication. The transceiver 1 includes a rod antenna 12 on the upper surface of a main body 10. The entire weight of the transceiver 1 is reduced such as by the use of a lithium-ion battery having a light weight and a large capacity as a power supply and, coupled with waterproofing of a housing 11, the transceiver 1 floats on water surface without sinking even if being dropped into water. The transceiver 1 floats on water surface in such a posture that the front surface of the housing 11 is located above and the rear surface is located below due to an internal center of gravity balance. Note that, in this description, drop to water surface is called "water submersion" for the sake of convenience.

A pair of electrodes 13, 13 are provided on the rear surface of the housing 11. The electrodes 13, 13 are electrically connected to each other by being short-circuited via water when the transceiver 1 is submerged in water. By this electrical connection, an internal circuit is activated and a water submersion notification operation of notifying a user of water submersion and a location is performed. In the water submersion notification operation, a backlight for a display 16 and a key panel 17 blinks and an alarm sound is emitted from a speaker 25 (see FIG. 2). Further, when the transceiver 1 is picked up from water surface, the emission of the alarm sound out of the water submersion notification operation is stopped and, instead, a speaker grill water discharge operation is performed. The speaker grill water discharge operation is an operation of emitting a water discharge sound of a large sound volume from the speaker 25 and discharging water clogged in the speaker grill 18 by that sound pressure.

Next, the external appearance of the transceiver 1 is described in detail. As described above, the transceiver 1 includes the main body 10 with the housing 11 and the antenna 12 provided on the upper surface of the housing 11. The antenna 12 is provided to extend upward on the upper surface of the housing 11. The antenna 12 is a rod-shaped antenna in which a coiled antenna wire is housed in a resin pipe.

The display 16, the key panel 17 and the speaker grill 18 are provided in this order from top on the front surface of the housing 11. The speaker 25 is provided inside the speaker grill 18. A PTT (push-to-talk) switch 19 is provided on the right side surface of the housing 11. An SP/MIC connector 14 mounted with a waterproof cap is provided to the left of the antenna 12 on the upper surface of the housing 11 when viewed from front.

The display 16 is a liquid crystal display (LCD) and includes an LED 61 (see FIG. 3) as a backlight on the rear surface. Various setting items besides a communication channel and a sound volume are displayed on the display 16. A plurality of key switches including a water discharge key 170, a direction key 171 and a power key 172 are arranged on the key panel 17. The power key 172 is a key switch for turning on and off the power supply and, when a user keeps this button on for a specified time (e.g. 2 seconds or longer), the power supply of the transceiver 1 is switched on from off or switched off from on. The direction key 171 includes up, down, left and right keys and an enter key and is used such as in the case of selecting/setting the set items displayed on the display 16. The water discharge key 170 is used in the case of manually performing the speaker grill water discharge operation described above. Further, the LED 61 (see FIG. 3) is provided as a backlight also on the rear surface of the key panel 171. Each key switch of the key panel 17 has a transparent or semitransparent key top and is illuminated from behind by the lighting of the backlight.

A clip holder 15 and the pair of electrodes 13, 13 are provided on the rear surface of the housing 11. A belt clip is attached to the clip holder 15 provided in the center of the rear surface. The electrodes 13, 13 are respectively provided on the left and right side of an upper part of the rear surface and electrically connected to each other by being short-circuited via water when the transceiver 1 is submerged in water. A control unit 30 (see FIG. 3) which is a control unit of the transceiver 1 detects water submersion of the transceiver 1 by this electrical connection.

Figure 2:
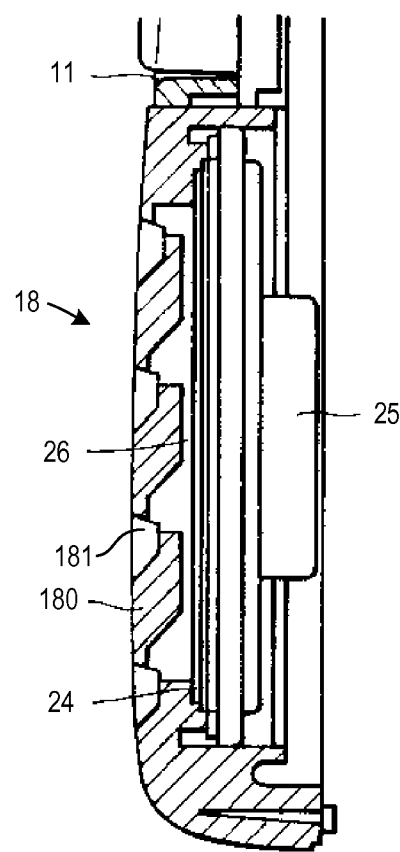
FIG. 2 is a vertical sectional view of the vicinity of a speaker grill of the transceiver.

FIG. 2 is a partial vertical sectional view of the vicinity of the speaker grill 18. The speaker grill 18 includes a plurality of crosspieces 180 formed in a lateral direction on the front surface of the housing 11. The respective crosspieces 180 have such a cross-section shaped to be inclined downward from a housing inner side toward a housing outer side and openings 181 formed between the respective crosspieces 180 are open downward to suppress entrance of rainwater and the like.

A recess having the same diameter as the speaker 25 is formed inside the speaker grill 18, and the speaker 25 is fitted and fixed in this recess. A foreign matter intrusion prevention net 24 is attached to the front surface of the speaker 25. The speaker 25 used is of a waterproof type. A space 26 is provided between the crosspieces 180 and the foreign matter intrusion prevention net 24. This space 26 facilitates the release of vibration (sound waves) of the speaker 25 to the outside from the speaker grill 18 and also function as a drainage path for draining water having entered inside the speaker grill 18 in a vertical direction.

Figure 3:
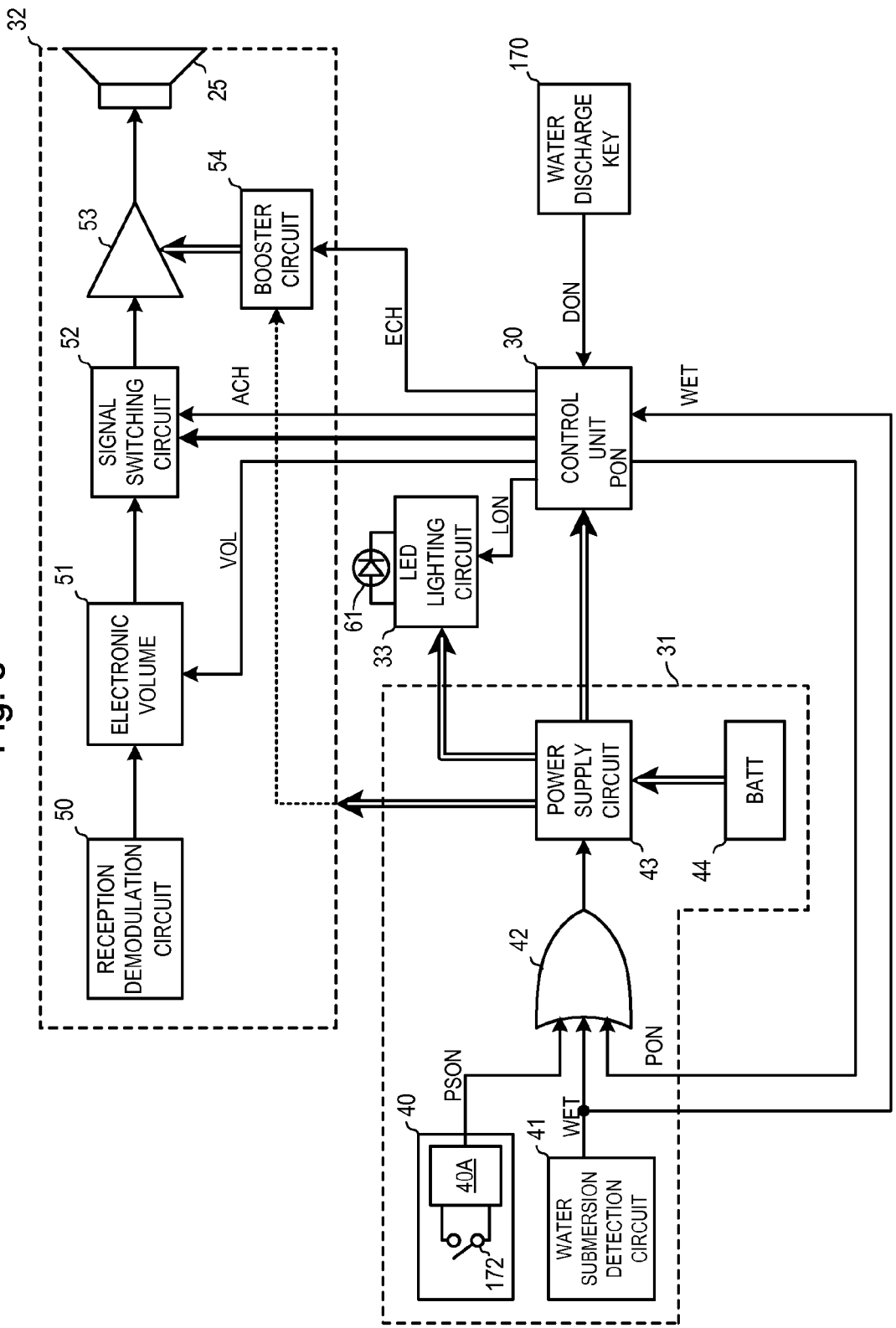
FIG. 3 is a block diagram of an electronic circuit of the transceiver.

A circuit configuration of the transceiver 1 is described with reference to a block diagram of FIG. 3. In FIG. 3, circuits relating to a power supply control and an audio signal processing are shown out of circuits of the transceiver 1. The transceiver 1 includes the control unit 30 that is the control unit, a power supply control circuit 31, a receiving circuit 32 and an LED lighting circuit 33. The control unit 30 is a so-called microcontroller (MCU, μC) including memories, various interfaces, A/D, D/A converters and the like in addition to a CPU, and controls the overall operation of the transceiver 1 including a water submersion monitoring operation shown in flow charts of FIGS. 4 and 5. The power supply control circuit 31 includes a battery 44 and controls the supply of power to the control unit 30, the receiving circuit 32 and the LED lighting circuit 33. The receiving circuit 32 receives a high-frequency signal and emits an audio signal. The speaker 25 shown in FIG. 2 is connected in the final stage of the receiving circuit. The LED lighting circuit 33 lights the LED 61 in accordance with an LED lighting signal LON input from the control unit 30. As described above, the LED 61 is used as the backlight for illuminating the display 16 and the key panel 17 from behind and achieves a function of notifying the location of the transceiver 1 by being controlled to blink in the event of water submersion.

The power supply control circuit 31 includes a power supply switching circuit 40, a water submersion detection circuit 41, an OR circuit 42, a power supply circuit 43 and a battery 44. The battery 44 is, for example, a lithium-ion battery and a voltage thereof is, for example, 7.4 V. The power supply switching circuit 40 includes the power key 172 described above and a hold circuit 40A. The hold circuit 40A outputs a power supply switch-on signal PSON. The hold circuit 40A reverses a state (H/L) of the PSON when the power key 172 is kept on for a specified time or longer. The PSON is input to the OR circuit 42. The water submersion detection circuit 41 includes the electrodes 13, 13 described above and outputs a water submersion signal WET. The water submersion detection circuit 41 keeps the WET at H-level while the electrodes 13, 13 are electrically connected. The WET is input to the OR circuit 42 and the control unit 30. A power maintenance signal PON output from the control unit 30 is input to the OR circuit 42 in addition to the PSON and the WET. The PON is described later.

An output of the OR circuit 42 is input to the power supply circuit 43. The power supply circuit 43 supplies power of the battery 44 to the control unit 30, the receiving circuit 32 and the LED lighting circuit 33 to set the transceiver 1 to a power-on state when an H-signal is input from the OR circuit 42

Accordingly, the OR circuit 42 outputs an H-signal and the transceiver 1 is powered on by the power supply circuit 43 when the power key 172 is turned on (when the PSON is at H-level), when water submersion is detected (when the WET is at H-level) or when the power maintenance signal PON of the control unit 30 is at H-level.

The power supply circuit 43 supplies the voltage of the battery 44 to each circuit after decreasing/increasing this voltage in accordance with an operating voltage of each circuit or while keeping this voltage as it is. Specifically, a power-supply voltage of 3V is supplied to the control unit 30 and a power-supply voltage of 5 V is supplied to the receiving circuit 32 and the LED lighting circuit 33.

The receiving circuit 32 includes a reception demodulation circuit 50, an electronic volume 51, a signal switching circuit 52, an AF amplifier 53, the speaker 25 and a booster circuit 54. The reception demodulation circuit 50 is a circuit for receiving a signal from a communication partner and demodulating it into a reception signal which is an audio signal. The demodulated reception signal is input to the electronic volume 51. The electronic volume 51 is a circuit for adjusting a signal level of the input reception signal, and various circuits such as a variable gain amplification circuit and a ladder resistance circuit can be adopted. The electronic volume 51 is controlled by a volume control signal VOL input from the control unit 30.

The signal switching circuit 52 inputs either one of the reception signal input from the electronic volume 51 and the audio signal input from the control unit 30 to the AF amplifier 53. An alarm sound, a water discharge sound and various beep sounds are input as audio signals from the control unit 30 to the signal switching circuit 52. The signal switching circuit 52 switches a selection end to either one of the electronic volume 51 and the control unit 30 in accordance with an audio switch signal ACH which is a control signal input from the control unit 30.

The alarm sound is an intermittent sound generated during the water submersion notification operation and a sine wave near 3 kHz audible with good sensitivity by human hearing. Further, a signal level of an alarm sound signal input to the AF amplifier 53 may be a maximum level, but may be determined to be an appropriate level capable of notifying the user of the position and suppressing power consumption of the battery 44.

The water discharge sound is a sound generated during the speaker grill water discharge operation and a rectangular wave of 300 Hz. Note that the frequency and waveform of the water discharge sound may be appropriately determined in conformity with conditions such as characteristics of the speaker 25, a capacity inside the speaker grill 18, and the shape of a communication equipment, but a frequency of 100 Hz to 500 Hz and the waveform of a rectangular wave or a saw-tooth wave are preferable. Further, the water discharge sound signal is a signal having an amplitude of a maximum input voltage of the AF amplifier 53. By vibrating the speaker 25 with the water discharge sound signal having the frequency, the waveform and the amplitude as described above, water clogged in the speaker grill 18 can be effectively discharged.

Further, in this receiving circuit 32, the signal switching circuit 52 is provided in a stage subsequent to the electronic volume 51 so that the water discharge sound signal and an alarm signal input to the AF amplifier 53 are not affected by the electronic volume 51, whereby a signal having a maximum sound volume can be input to the AF amplifier 53. Note that in the case of supplying a normal beep sound signal to the AF amplifier 53 from this position, a level adjustment may be performed by the control unit 30 in advance and the signal may be input to the signal switching circuit 52.

The AF amplifier 53 amplifies an input audio signal to a level at which the speaker 25 can be driven. The amplified audio signal is output to the speaker 25. A power-supply voltage is supplied to the AF amplifier 53 via the booster circuit 54. The booster circuit 54 is a circuit for supplying a voltage (5 V) supplied from the power supply circuit 43 to the AF amplifier 53 as it is or after boosting it in accordance with a voltage switch signal ECH input to the control unit 30. The booster circuit 54 supplies the voltage input from the power supply circuit 43 as it is to the AF amplifier 53 via a bypass line when the ECH is at L-level. The booster circuit 54 supplies the voltage to the AF amplifier 53 after boosting it to 8 V when the ECH is at H-level. The booster circuit 54 is preferably a charge pump circuit, but may be another type of circuit (e.g. chopper circuit). Further, without providing a circuit for boosting a voltage, the voltage (7.4 V) of the battery 44 may be directly introduced and supplied to the AF amplifier 53 when the ECH is at H-level.

A maximum output of the AF amplifier 53 is about 0.8 W at a normal power-supply voltage (5 V) and about 1.8 to 2.0 W at a boosted power-supply voltage (8 V). By using the boosted power-supply voltage and vibrating the speaker 25 with a water discharge sound signal having a large output (amplitude), water can be more efficiently discharged from the speaker grill 18 by a high sound pressure. Note that the speaker 25 used withstands an input of 2 W.

Since the power-supply voltage of the AF amplifier 53 is increased at the time of water discharge and the water discharge sound signal having an amplitude of a maximum input voltage is input to the AF amplifier 53 in this way, the speaker 25 can be vibrated by a very high sound pressure and a high water discharge effect can be obtained.

The control unit 30 is activated by the supply of the power-supply voltage from the power supply circuit 43 and performs the following operations by controlling the operation of the transceiver 1, particularly monitoring a change of the water submersion signal WET input from the water submersion detection circuit 41.

When the WET input from the water submersion detection circuit 41 changes from L-level to H-level, it is judged that the transceiver 1 has been submerged in water and the following operations are performed. Even if the power supply is off, an output of the OR circuit 42 becomes H-level and the power of the battery 44 is supplied to the control unit 30 via the power supply circuit 43 when the WET changes to H-level, wherefore the control unit 30 is activated and the following operations are performed.

(1) The LED 61 is blinked. Thus, the LED lighting signal LON input to the LED lighting circuit 33 is switched between H-level and L-level at time intervals of about 0.5 seconds. The LED lighting circuit 33 applies a current to the LED 61 to light the LED 61 when the LON becomes H-level. Since the state of the LON is cyclically and repeatedly switched between H-level and L-level, the LED 61 blinks.

(2) An alarm sound is generated. Thus, by raising the audio switch signal ACH to H-level, the signal switching circuit 52 is switched to the control unit 30 and an audio signal of an alarm sound is input to the signal switching circuit 52. Unless the inside of the speaker grill 18 is completely closed by water, this alarm sound is emitted to the outside and reaches the user.

(3) The power maintenance signal PON is raised to H-level. That is, the control unit 30 raises the PON to H-level and inputs it to the OR circuit 42 and keeps the power supply on regardless of the state of the power supply switch-on signal PSON during a series of water submersion dealing operations (water submersion notification operation and speaker grill water discharge operation).

When the WET changes from H-level to L-level thereafter, the control unit 30 performs the following operations, judging that the transceiver 1 has been picked up from water surface.

(1) The alarm sound is stopped and a water discharge sound is generated. That is, the audio signal input to the signal switching circuit 52 is switched from the alarm sound signal to the water discharge sound signal.

(2) The power-supply voltage of the AF amplifier 53 is switched to a high voltage. Thus, the voltage switch signal ECH to be output to the booster circuit 54 is raised to H-level.

(3) Timers 1, 2 for measuring a blinking period of the LED 61 and a water discharge sound generation period are started. Note that an expiration period of the timer 1 for determining the blinking period of the LED 61 after the pickup can be set within a range of 5 to 30 seconds by the user. Note that an expiration period of the timer 2 for determining the water discharge sound generation period may be set to an appropriate period based on the size and shape of the speaker grill 18, the output of the speaker 25 and the like and, for example, a period of about 10 seconds is appropriate. Further, it is also possible to enable setting by the user. At this time, considering a stress given to the speaker 25 by the water discharge sound, an upper limit to the expiration period of the timer 2 may be provided and setting of an expiration period exceeding this upper limit may not be accepted.

When the timer 1 reaches the set time thereafter, the blinking of the LED 61 is stopped. That is, the LON signal is fixed to L-level. Further, when the timer 2 reaches the set time, the generation of the water discharge sound is stopped. That is, the control unit 30 stops the output of the water discharge sound signal, and lowers the audio switch signal ACH to L-level and switches the signal switching circuit 52 to the electronic volume 51. Further, the control unit 30 lowers the voltage switch signal to L-level and switches the power-supply voltage supplied to the AF amplifier 53 to a low voltage.

In the speaker grill water discharge operation of generating the water discharge sound from the speaker 25, the water discharge sound is initially not transmitted to the outside but water is ejected from the speaker grill 18 by the sound pressure of the water discharge sound if the inside of the speaker grill 18 is filled with water. As the water inside the speaker grill 18 decreases, the water discharge sound starts to become audible outside. The water inside the speaker grill 18 is substantially completely discharged within an operation time of about 10 seconds.

Until one of the timers 1, 2 reaches the set time after the transceiver 1 is picked up from water surface, the blinking of the LED 61 and the generation of the water discharge sound are performed in parallel. This enables the user to recognize the generation of the water discharge sound by the blinking of the LED 61 even if the water discharge sound from the picked-up transceiver 1 is not audible.

When the both timers 1, 2 reach each set time, the control unit 30 lowers the PON to L-level after both the blinking of the LED 61 and the generation of the water discharge sound are stopped. If the power supply switch-on signal PSON is set to H-level by the operation of the power key 172, a powered-on state is maintained. If the PSON is at L-level, the power supply is turned off by setting the PON to L-level. That is, the power supply circuit 43 stops the supply of power.

Note that the water discharge key 170 connected to the control unit 30 is a key switch used to manually perform the speaker grill water discharge operation. When the water discharge key 170 is turned on by the user, a DON signal input to the control unit 30 is pulled up to H-level. While this DON signal of H-level is detected, the control unit 30 switches the signal switching circuit 52 to the control unit 30 and inputs the water discharge sound signal to the signal switching circuit 52 by raising the audio switch signal ACH to H-level. Further, the control unit 30 switches the power-supply voltage of the AF amplifier 53 to a high voltage by raising the voltage switch signal ECH to be output to the booster circuit 54 to H-level.

The above water submersion monitoring process by the control unit 30 is described with reference to flow charts of FIGS. 4 and 5. Note that although a status flag ST indicating the status of the water submersion dealing process is provided in this process, it is not essential. The status flag ST has four statuses of 0, 1, 2 and 3 and a default is 0.

FIG. 4A is a flow chart showing a main routine of the water submersion monitoring process. This process is performed at predetermined time intervals (e.g. every 10 ms). In this process, the control unit 30 determines whether or not the WET, which is the water submersion signal, has been raised from L-level to H-level (S1), whether or not the WET has been lowered from H-level to L-level (S2), whether or not the timer 1 reaches the set time (S3) and whether or not the timer 2 reaches the set time (S4).

Here, the rise and fall of the WET are detected by comparing the WET and the status flag ST. That is, the rise of the WET is determined when the status flag ST is in a status other than 1 and the H-level of the WET is detected. Since the status flag ST is rewritten to 1 in a water submersion process immediately thereafter, there is no possibility of "ST≠1 and WET=H" until the transceiver 1 is submerged in water again after being picked up. Note that since the status flag ST is reset to 0 when the control unit 30 is activated, "ST=0 and WET=H" when the control unit 30 is activated and the main routine of FIG. 4A is first executed even if the transceiver 1 is submerged in water while the power supply is off. By this, the rise of the WET can be detected. Further, the fall of the WET is determined by detecting L-level of the WET in a state where the status flag ST is 1.

When the WET rises (YES in S1), the control unit 30 performs the water submersion process (FIG. 4B), assuming that the transceiver 1 has been submerged in water (S5). When the WET falls (YES in S2), the control unit 30 performs a pickup process (FIG. 4C), assuming that the transceiver 1 has been picked up from water surface (S6). When the timer 1 reaches the set time (YES in S3), the control unit 30 performs a blinking stop process (FIG. 5A), assuming that the blinking period of the LED 61 has been finished (S7). When the timer 2 reaches the set time (YES in S4), the control unit 30 performs a water discharge stop process (FIG. 5B), assuming that the water discharge sound generation period has been finished (S8).

The water submersion process, the pickup process, the blinking stop process and the water discharge stop process are described with reference to FIGS. 4B, 4C, 5A and 5B.

FIG. 4B is a flow chart showing the water submersion process performed by the control unit 30 when the WET rises from L-level to H-level. In the water submersion process, the control unit 30 first starts blinking the LED 61 (S11). That is, the control unit 30 activates a LED blinking signal generation routine. The LED blinking signal generation routine is a routine for switching the state of the LED lighting signal LON between H-level and L-level at time intervals of about 0.5 seconds and inputting it to the LED lighting circuit 33. The control unit 30 starts the generation of an alarm sound (S12). That is, the control unit 30 activates an alarm sound signal generation routine. The alarm sound signal generation routine is a routine for generating a signal waveform (e.g. sine wave having a maximum amplitude of 1 kHz) of the alarm sound. The generated signal waveform is input to the signal switching circuit 52. The control unit 30 raises the PON signal (S13). Then, the control unit 30 sets the status flag ST to 1 (S14).

FIG. 4C is a flow chart showing the pickup process performed when the WET falls from H-level to L-level. In the pickup process, the control unit 30 stops the alarm sound (S21) and starts the speaker grill water discharge operation of generating a water discharge sound (S22). That is, the control unit 30 stops the alarm sound signal generation routine and activates a water discharge sound signal generation routine, and raises the voltage switch signal ECH to be output to the booster circuit 54 to H-level. The water discharge sound signal generation routine is a routine for generating a signal waveform (e.g. rectangular wave having a maximum amplitude of 300 Hz) of the water discharge sound. The generated signal waveform is input to the signal switching circuit 52. The control unit 30 starts the timers 1, 2 (S23). Then, the control unit 30 sets the status flag ST to 2 (S24).

Figure 5A:
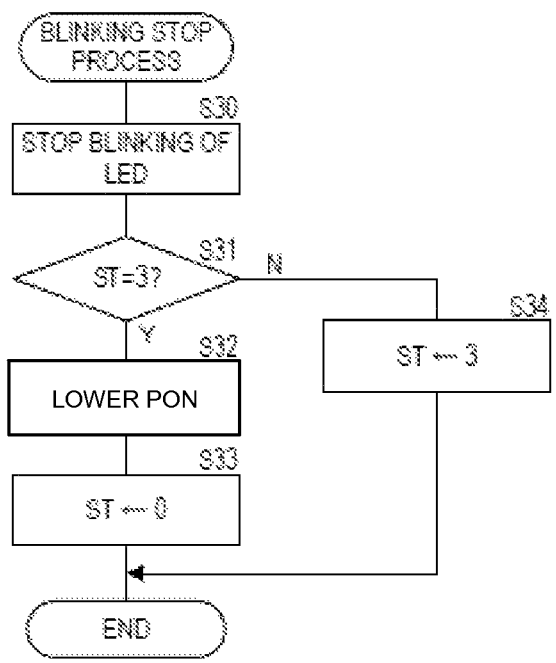
FIGS. 5A and 5B are flow charts showing operations of the control unit of the transceiver.

FIG. 5A is a flow chart showing the blinking stop process performed when the timer 1 reaches the set time. First, the control unit 30 stops the blinking of the LED 61 (S30). That is, the control unit 30 stops the LED blinking signal generation routine. Subsequently, the control unit 30 determines whether or not the status flag ST is "3" indicating that the other time (timer 2) already reaches the set time (S31). If the status flag ST is 3 (YES in S31), the control unit 30 lowers the PON from H-level to L-level (S32) and sets the status flag ST to 0 indicating no water submersion (S33), thereby finishing the operation. If the status flag ST is not 3 (remains to be 2) (NO in S31), the control unit 30 sets the status flag ST to 3 (S34), thereby finishing the operation.

Figure 5B:
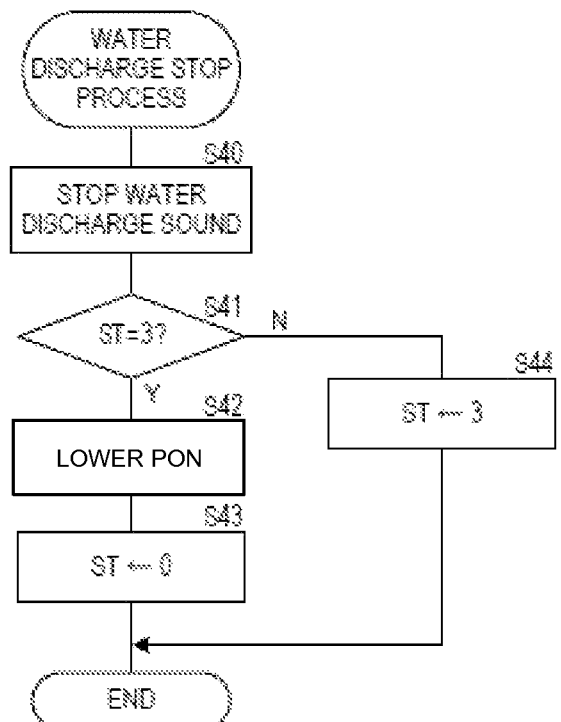

FIG. 5B is a flow chart showing the water discharge stop process performed when the timer 2 reaches the set time. First, the control unit 30 stops the speaker grill water discharge operation (S40). That is, the control unit 30 stops the water discharge sound signal generation routine, and switches the signal switching circuit 52 to the electronic volume 51 by lowering the audio switch signal ACH to L-level and switches the power-supply voltage to be supplied to the AF amplifier 53 to the low voltage by lowering the voltage switch signal to L-level. Subsequently, the control unit 30 determines whether or not the status flag ST is "3" indicating that the other timer (timer 1) already reaches the set time (S41). If the status flag ST is 3 (YES in S41), the control unit 30 lowers the PON from H-level to L-level (S42) and sets the status flag ST to 0 indicating no water submersion (S43), thereby finishing the operation. If the status flag ST is not 3 (remains to be 2) (NO in S41), the control unit 30 sets the status flat ST to 3 (S44), thereby finishing the operation.

Although this invention has been described, taking the handy transceiver for marine communication as an example, this invention is also applicable to electronic devices other than handy transceivers. Further, application to stationary electronic devices is also possible.

Further, although the transceiver 1 of this embodiment is configured to be waterproof and float on water (have a smaller specific weight than water), it is also possible to apply the present invention to electronic devices having a specific weight equal to or higher than water.

It will be obvious to those having skill in the art that many changes may be made in the above-described details of the preferred embodiments of the present invention. The scope of the present invention, therefore, should be determined by the following claims.

What is claimed is:

1. An electronic device, comprising:
   a speaker:
   an amplifier for driving the speaker;
   a speaker grill provided on the front surface of the speaker;
   a water submersion detection unit for detecting that the electronic device has dropped onto water surface or, into water (hereinafter, referred to as "water submersion") and detecting that the electronic device has been picked up from the water surface or from the water (hereinafter, referred to as "pickup");
   a sound signal generation unit for generating a water discharge sound signal for discharging water having entered inside the speaker grill according to the detection of the pickup and inputting the generated water discharge sound signal to the amplifier;
   a power supply circuit for setting the sound signal generation unit
      in a power-on state when the water submersion is detected, and
      in a power-off state when the water discharge sound signal that is started generating according to the detection of the pickup is stopped, and
   an OR circuit that makes the power supply circuit keep the sound signal generation unit in the power-off state when the water discharge sound is stopped in the case that the sound signal generation unit has been set in the power-off state since before the water submersion is detected.

2. The electronic device according to claim 1, wherein the sound signal generation unit performs the generation of the water discharge sound signal and the input to the amplifier for a predetermined time.

3. The electronic device according to claim 1, further comprising a sound volume adjustment circuit provided in a stage preceding the amplifier for adjusting a signal level of a sound signal to be input to the amplifier,
   wherein the sound signal generation unit inputs the water discharge sound signal to the amplifier without via the sound volume adjustment circuit.

4. The electronic device according to claim 1, further comprising a booster unit for boosting a power-supply voltage to be supplied to the amplifier to a voltage higher than a normal operation voltage in synchronization with the input of the water discharge sound signal to the amplifier by the sound signal generation unit.

5. The electronic device according to claim 1, further comprising a light emission circuit including a light emitting element and configured to light or blink the light emitting element in parallel to the input of the water discharge sound signal to the amplifier by the sound signal generation unit.

6. The electronic device according to claim 1, wherein the sound signal generation unit generates an alarm sound signal for notifying the position of the electronic device and inputs the generated alarm sound signal to the amplifier until the electronic device is picked up after the water submersion.

7. The electronic device according to claim 1, wherein the water submersion detection unit includes a pair of electrodes and detects the water submersion by an electrical connection of these electrodes to each other while detecting the pickup by the electrodes being electrically separated thereafter.

* * * * *